United States Patent
Rebeor

(10) Patent No.: US 6,377,098 B1
(45) Date of Patent: Apr. 23, 2002

(54) CMOS LATCH HAVING A SELECTABLE FEEDBACK PATH

(75) Inventor: Chris J. Rebeor, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/556,923

(22) Filed: Apr. 21, 2000

(51) Int. Cl.[7] ............................................... H03K 3/356
(52) U.S. Cl. ..................... 327/210; 327/212; 327/230
(58) Field of Search ................................ 327/199, 207, 327/208, 210, 211, 212, 214, 230, 427, 433; 714/726, 729

(56) References Cited

U.S. PATENT DOCUMENTS

| | | | | |
|---|---|---|---|---|
| 4,698,588 A | * | 10/1987 | Hwang et al. ............ 324/73 R |
| 4,988,896 A | | 1/1991 | Chu .......................... 371/22.3 |
| 5,023,783 A | * | 6/1991 | Hwang et al. ............ 324/73.1 |
| 5,663,669 A | * | 9/1997 | Vanderschaaf ............ 327/201 |
| 5,748,643 A | | 5/1998 | Pelella et al. ............ 371/22.3 |
| 5,760,627 A | * | 6/1998 | Gregor et al. ............ 327/215 |
| 5,764,656 A | * | 6/1998 | Pellela et al. ............ 714/726 |
| 5,767,717 A | * | 6/1998 | Schorr et al. ............ 327/210 |
| 5,784,384 A | * | 7/1998 | Maeno ....................... 714/726 |
| 5,887,004 A | | 3/1999 | Walther ................... 371/22.31 |
| 6,020,772 A | * | 2/2000 | Hayashi et al. ............ 327/202 |
| 6,240,536 B1 | * | 5/2001 | Mikan, Jr. et al. ......... 714/727 |
| 6,272,654 B1 | * | 8/2001 | Freiburger ................. 714/714 |

* cited by examiner

Primary Examiner—Kenneth B. Wells
Assistant Examiner—Hai L. Nguyen
(74) Attorney, Agent, or Firm—Schmeiser, Olsen & Watts; Richard A. Henkler

(57) ABSTRACT

A latch device having a selectable feedback path includes a retaining device and system isolation device. The retaining device retains within the feedback path a logical value to be written out. The logical value is latched during an active clock signal. The system isolation device disconnects the retaining device from the feedback path during a write operation. Then, when the logical value is written out, the system isolation device reconnects the retaining device. Thus, the feedback path of the latch device may be disconnected to allow for a change in the latch state without overdriving a feedback inverter.

20 Claims, 2 Drawing Sheets

CMOS LATCH HAVING A SELECTABLE FEEDBACK PATH

BACKGROUND OF THE INVENTION

1. Technical Field

The invention relates generally to integrated circuits, and more specifically, to integrated circuits having high speed complementary metal oxide semiconductor (CMOS) latch circuits.

2. Related Art

Many conventional CMOS latch circuits use cross-coupled inverters having a feedback inverter for latching data within the latch circuit. A data input inverter, usually consisting of a PFET and/or NFET device, clocks data into the cross-coupled inverters. In such a conventional latch, the feedback inverter of the cross-coupled inverters must be smaller than the data input inverter so that the data inverter can overdrive the feedback inverter in order to change the state of the latch. The requirement of different sizes for the inverters, however, makes it difficult to implement the latch in a gate array design where only one device size is available.

In CMOS integrated circuit chips, the power supply voltages are constantly decreasing with each new technology generation. To properly design CMOS latch circuits for use in memory cells, the circuits must be functional at a predetermined low voltage (e.g., 0.6 V) to allow for a margin of uncertainty. Since many conventional CMOS latch circuits require a significant amount of device current to overcome the feedback inverter for changing the state of a latch circuit, this predetermined low voltage may be difficult to achieve.

Some examples of latch circuits that address the problems existing with conventional CMOS latch circuits are found in the following U.S. Patents: U.S. Pat. No. 5,887,004, "Isolated Scan Paths," issued March 1999 to Walther; and U.S. Pat. No. 4,988,896, "High Speed CMOS Latch without Pass-Gates," issued January 1991 to Chu.

Walther discloses a method of isolating scan paths, which are used in testing integrated circuits such as latch circuits, to reduce power consumption. Although the power consumption may be reduced through isolating the scan paths, the details of the system path are not disclosed in the Walther reference, and thus, the system will still require a significant amount of device current to change the state of a latch circuit.

Chu discloses a latch circuit that isolates the latch nodes during the clocking cycle so that all of the device current is available to charge the node capacitance. Chu, though, is limited by the clock. That is, the data will not be held or valid in the latch circuit until the clock is released. Hence, when the clock is present, there is a chance for noise and/or invalid data.

Accordingly, a need has developed in the art for a latch circuit that will not only operate at a predetermined low voltage, but will quickly reach a valid state of operation during an active clock signal.

SUMMARY OF THE INVENTION

It is thus an advantage of the present invention to provide a latch device that eliminates the above described limitations.

The foregoing and other advantages of the invention are realized by a latch device having a selectable feedback path, wherein the path may be disconnected to allow the latch state to be changed without overdriving a feedback inverter.

Generally, the present invention provides a latch device comprising:

a feedback path;

a retaining device for retaining within said feedback path a logical value to be written out, said logical value being latched during an active clock signal; and a system isolation device for disconnecting said retaining device from said feedback path during a write operation, and for reconnecting said retaining device in response to the logical value being written out.

In addition, the present invention provides a method for writing and reading a first and second logical value with a latch device having a feedback path comprising the steps of:

a) retaining within said feedback path said first logical value to be written out;

b) disconnecting said feedback path during a write operation;

c) reconnecting said feedback path in response to the first logical value being written out;

d) writing a second logical value into said feedback path of said latch device; and e) latching said second logical value into said feedback path during an active clock signal.

The present invention also provides an integrated circuit system having a scanable CMOS memory cell, said CMOS memory cell comprising:

a write port receiving a logical value and write signals;

a feedback path;

a retaining device, coupled to said write port, for retaining within said feedback path said logical value, said retaining device latching said logical value during an active clock signal; and a system isolation device for disconnecting said retaining device from said feedback path during a write operation, and for reconnecting said retaining device in response to the logical value being written out.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and wherein.

DETAILED DESCRIPTION OF THE DRAWINGS

Figure 1:
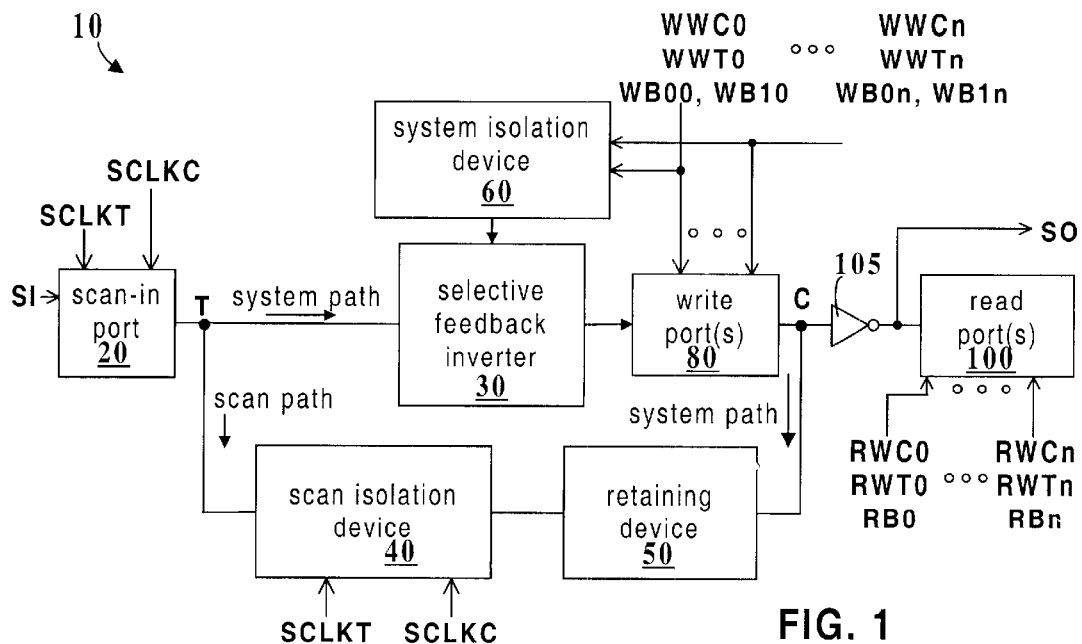
FIG. 1 is a block diagram of a latch device in accordance with a preferred embodiment of the present invention.

FIG. 1 illustrates a block diagram of latch device 10 having a scan-in port 20, selective feedback inverter 30, scan isolation device 40, retaining device 50, system isolation device 60, write port 80, read port 100, and inverter 105 in accordance with a preferred embodiment of the present invention. Although latch device 10 may be used in systems with latch circuitry, latch device 10 is preferably a scanable, CMOS memory cell within an integrated circuit chip.

Scan-in port 20 receives scan-in data SI, scan clock signal SCLKT (scan clock true), and its complementary clock signal SCLKC (scan clock complementary). Scan-in port 20 is coupled to selective feedback inverter 30 and scan isolation device 40 at node T. Scan isolation device 40 receives scan clock signals SCLKT and SCLKC and is coupled to retaining device 50. Retaining device 50 is coupled to write port 80 and inverter 105 at node C. Selective feedback inverter 30 is coupled to system isolation device 60 and write port 80. The output of inverter 105 is coupled to read port 100 and outputs scan-out data SO.

System isolation device 60 and write port 80 receive write signals WWC (write word line complementary), WWT (write word line true), WB0 (write bit line 0), and WB1 (write bit line 1) for each write port 0–n (e.g., if there are two write ports, port 0 and port 1, then the write signals include WWC0, WWC1, WWT0, WWT1, WB00, WB10, WB01, and WB11). As will be seen in subsequent examples, if there is only one write port (port 0), the "0"'s on the end will be dropped (i.e., WWC, WWT, WB0, and WB1).

Read port 100 receive read signals RWC (read word line complementary), RWT (read word line true), and RB (read bit line) for each read port 0–n. As with the write ports, if there is only one read port (port 0), the "0"'s on the end will be dropped (see FIG. 2).

In operation, latch device 10 may be used in test mode or system mode. In test mode, scan-in data SI, having a test value, enters the latch device 10 through scan-in port 20, follows the scan path and is outputted as SO. The scan path includes scan isolation device 40, retaining device 50 and inverter 105. Retaining device 50 holds the logical (or test) value of SI on node T and, when the data is to be outputted, retaining device 50 inverts the data (SI), which is re-inverted through inverter 105 and outputted as SO. When new data is inputted into scan-in port 20, scan isolation device 40 detaches the retaining device 50 from the scan path. That is, scan isolation device 40 creates a break in the scan path, allowing the new data to be written into node T without having to overdrive the retaining device 50 (as will be discussed in greater detail in reference to FIG. 2).

In system mode, data enters the latch device 10 through write port 80, and leaves the latch device 10 through read port 100. The data is latched in the system through retaining device 50 (at node T) and selective feedback inverter 30 (the data's complemented value at node C). Thus, retaining device 50 and selective feedback inverter 30 retain within the system path, which is a feedback path, a logical value to be written out. The logical value may be latched during an active clock signal. System isolation device 60 disconnects retaining device 50 from the feedback path during a write operation. That is, selective feedback inverter 30, which is controlled by system isolation device 60, is turned off, thus breaking the system path. System isolation device 60 then reconnects the retaining device 50 in response to the logical value being written out. The system isolation device 60 is controlled by write signals WWC, WWT, WB0 and WB1. The system feedback path includes retaining device 50, scan isolation device 40 (which is continually on for system mode), selective feedback inverter 30, and write port 80. In the system mode, new data may be written into latch device 10 without needing current to overdrive the retaining device 50 and selective feedback inverter 30 by using the system isolation device 60 to disjoin the system path through selective feedback inverter 30.

Thus, an advantage of the present invention is the ability to decrease the amount of current required to change the state of the latch 10 for both test mode and system mode. This is possible through scan isolation device 40 (for test mode) and system isolation device 60 (for system mode). That is, instead of having to overdrive the retaining device 50 to change the latch state, the scan isolation device 40 and system isolation device 60 allow a break in the scan or system path. Therefore, latch device 10 requires less voltage when changing states.

Figure 2:
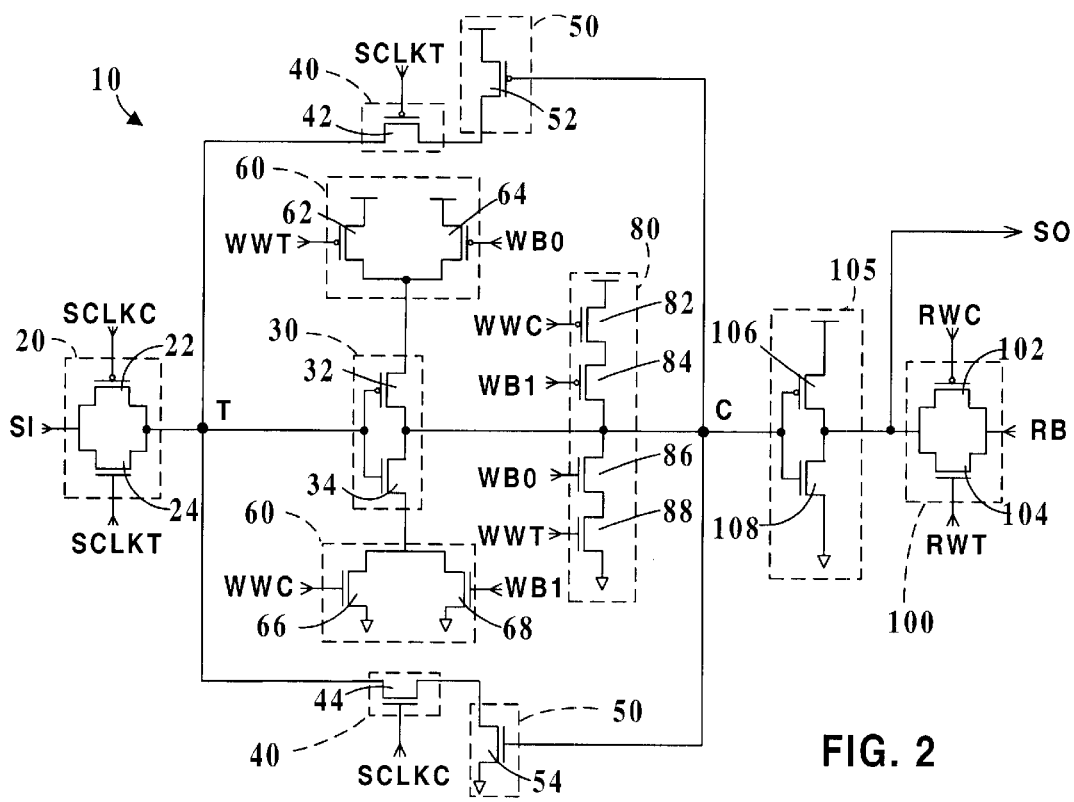
FIG. 2 is a circuit diagram of the latch device of FIG. 1 having one read port and one write port.

FIG. 2 illustrates a circuit diagram of latch device 10 having a single read port 100 and a single write port 80. Scan-in port 20 comprises two field-effect transistors (FETs), a P-type FET transistor (PFET) 22 and an N-type FET transistor (NFET) 24. Although metal-oxide-semiconductor FETs (MOSFETs) are preferred in the present invention, other transistor types may also be used for various latch circuits. PFET 22 and NFET 24 are connected in parallel between scan-in input SI and node T. The gates of PFET 22 and NFET 24 receive SCLKC and SCLKT, respectively. Thus, PFET 22 and NFET 24 form a transmission gate.

Selective feedback inverter 30 comprises PFET 32 and NFET 34. PFET 32 and NFET 34 are connected in series between the top leg (elements 62 and 64) of isolation device 60 and the bottom leg (elements 66 and 68) of isolation device 60. That is, the gates of PFET 32 and NFET 34 are tied together and to node T. The source of PFET 32 is coupled to the drains of PFETs 62 and 64 of system isolation device 60. The source of NFET 34 is coupled to the drains of NFETs 66 and 68 of system isolation device 60. The drains of PFET 32 and NFET 34 are tied together and to node C.

Scan isolation device 40 comprises PFET 42 and NFET 44. PFET 42 is coupled between node T and the drain of PFET 52 of retaining device 50. The gate of PFET 42 is coupled to SCLKT. NFET 44 is coupled between node T and the drain of NFET 54 of retaining device 50. The gate NFET 44 is coupled to SCLKC.

Retaining device 50 comprises PFET 52 and NFET 54. The sources of PFET 52 and NFET 54 are tied to Vdd and ground, respectively. The gates of PFET 52 and NFET 54 are tied together and coupled to node C. The drains of PFET 52 and NFET 54 are coupled to the drain of PFET 42 and the source of NFET 44, respectively, of scan isolation device 40.

System isolation device 60 comprises PFETs 62 and 64 and NFETs 66 and 68. The sources of PFETs 62 and 64 are tied to Vdd. The drains of PFETs 62 and 64 are tied together and to the source of PFET 32 of selective feedback inverter 30. The gate of PFET 62 receives write signal WWT and the gate of PFET 64 receives write signal WB0. The sources of NFETs 66 and 68 are tied to ground. The drains of NFETs 66 and 68 are tied together and to the source of NFET 34 of selective feedback inverter 30. The gate of NFET 66 receives write signal WWC and the gate of NFET 68 receives write signal WB1.

Write port 80 comprises PFETs 82 and 84 and NFETs 86 and 88. PFETs 82 and 84 are connected in series between Vdd and node C. That is, the source of PFET 82 is tied to Vdd. The gate of PFET 82 receives the write signal WWC. The drain of PFET 82 is coupled to the source of PFET 84. The gate of PFET 84 receives the write signal WB1. The drain of PFET 84 is coupled to node C. NFETs 86 and 88 are connected in series between node C and ground. That is, the source of NFET 88 is tied to ground. The gate of NFET 88 receives the write signal WWT. The drain of NFET 88 is coupled to the source of NFET 86. The gate of NFET 86 receives the write signal WB0. The drain of NFET 86 is coupled to node C.

Inverter 105 comprises PFET 106 and NFET 108. PFET 106 and NFET 108 are connected in series between Vdd and ground. That is, the sources of PFET 106 and NFET 108 are tied to Vdd and ground, respectively. The gates of PFET 106 and NFET 108 are tied together and to node C. The drains of PFET 106 and NFET 108 are tied together and to read port 100. The output scan-out signal SO is taken from the output of inverter 105.

Read port 100 comprises PFET 102 and NFET 104. The gate of PFET 102 receives the read signal RWC. The gate of PFET 104 receives the read signal RWT. PFET 102 and NFET 104 are connected in parallel between the output of inverter 105 and the input read signal RB. PFET 102 and NFET 104 form a transmission gate.

In test mode, scan-in port 20 receives scan-in data SI, and scan clocks, SCLKC and SCLKT. When the scan clocks turn on (SCLKT=1, SCLKC=0), PFET 42 and NFET 44 are turned off, breaking the scan path and allowing SI to be written into node T. When the scan clocks turn off (SCLKT=0, SCLKC=1), PFET 42 and NFET 44 are turned on, and, in combination with retaining device 50, hold the value written into the latch device 10.

In system mode, when the write word line is high (WWT=1, WWC=0, WB0=WB1=system data), PFET 62 and NFET 66 are turned off. Then, depending on the value of the system data, either PFET 64 or NFET 68 will be off, causing the selective feedback inverter 30 to be off, thus, breaking the feedback path of the latch device 10 and allowing the complement of the system data value to be written into node C. When the system clocks turn off and the write word line is low (WWT=0, WWC=1, WB0=0, WB1=1), PFET 62, PFET 64, NFET 66 and NFET 68 are allowed to turn on, and with selective feedback inverter 30, hold the value written into the latch device 10.

Thus, because of the structure of the feedback path of the present invention, the logical value of the system data may be latched during an active system clock, allowing the data to be valid when outputted.

Another advantage of the present invention includes being able to disconnect the system path and scan path in two different areas (at the scan isolation device 40 and at the selective feedback inverter 30), to keep the number of series NFETs and PFETs to a minimum. This reduces the soft error rate (e.g., cosmic and alpha particle charges that can flip the state of the latch device) in the system.

Furthermore, in the present invention, the scan-in port and read port are added as transmission gates and do not need a power supply connection, which allows for a very dense physical layout and very fast performance.

Figure 3:
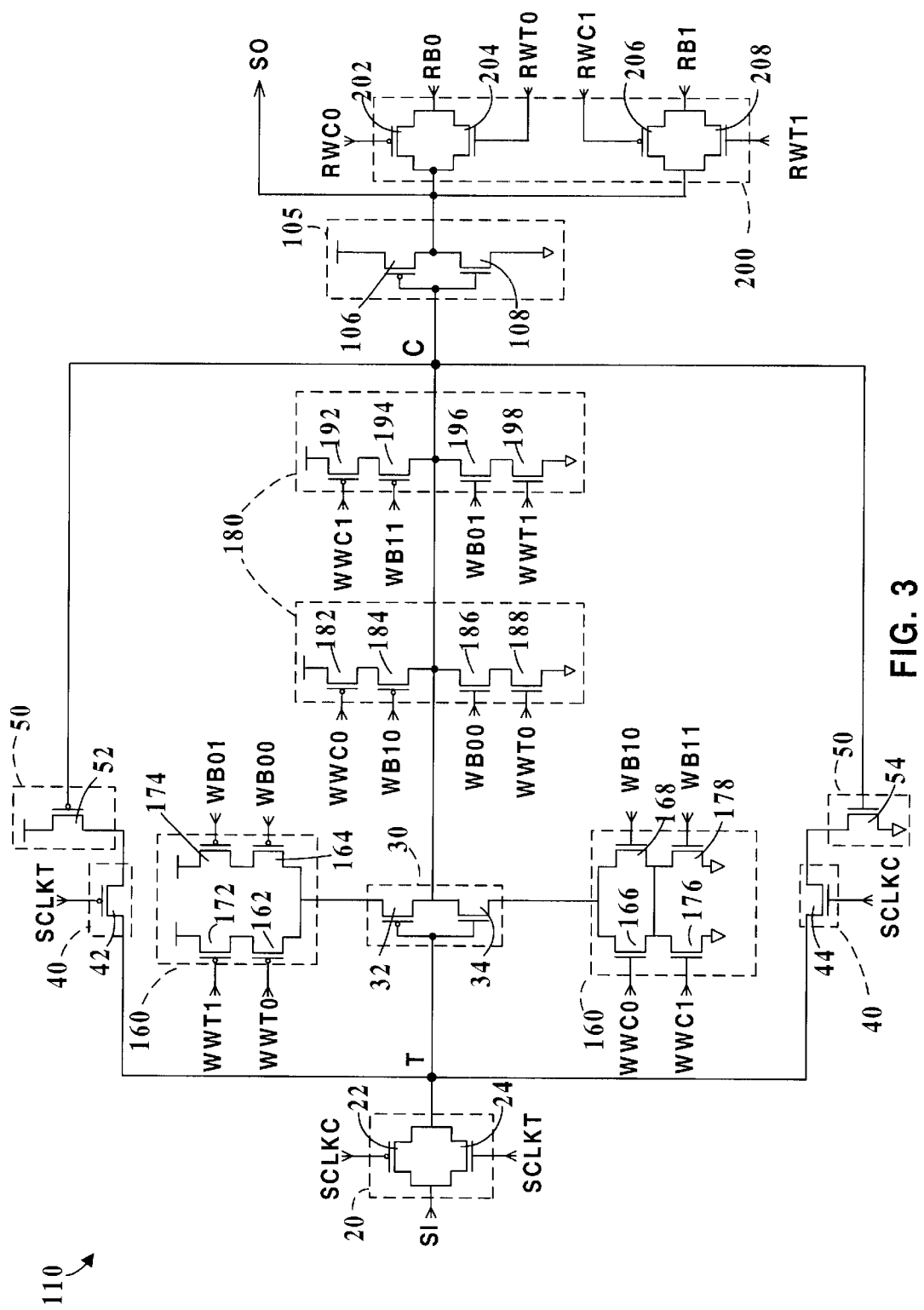
FIG. 3 is a circuit diagram of the latch device of FIG. 1 having two read ports and two write ports.

FIG. 3 illustrates a circuit diagram of latch device 110, which is similar in structure to latch device 10 of FIG. 2 except for the number of read and write ports and the elements of system isolation device 160.

Read and write ports 200 and 180 of FIG. 3 are similar in structure to read and write ports 100 and 80 of FIG. 2, except there are now two ports each in FIG. 3. Elements 182–188 and 202–204 correspond to, and are connected the same as, elements 82–88, and 102–104 of FIG. 2. Elements 192–198 comprise the second write port, and elements 206–208 comprise the second read port (206–208). In the second write port, PFETs 192 and 194 are connected in series between Vdd and node C. That is, the source of PFET 192 is tied to Vdd. The gate of PFET 192 receives the write signal WWC1. The drain of PFET 192 is coupled to the source of PFET 194. The gate of PFET 194 receives the write signal WB11. The drain of PFET 194 is coupled to node C. NFETs 196 and 198 are connected in series between node C and ground. That is, the source of NFET 198 is tied to ground. The gate of NFET 198 receives the write signal WWT1. The drain of NFET 198 is coupled to the source of NFET 196. The gate of NFET 196 receives the write signal WB01. The drain of NFET 196 is coupled to node C.

In the second read port, the gate of PFET 206 receives the read signal RWC1 and the gate of NFET 208 receives the read signal RWT1. PFET 206 and NFET 208 are connected in parallel between the output of inverter 105 and input read signal RB1.

System isolation device 160 of FIG. 3 is similar in structure to system isolation device 60 of FIG. 2, except there are additional transistors (elements 172 and 174 making up an additional top leg, connected in series to elements 162 and 164, respectively; and elements 176 and 178 making up an additional bottom leg, connected in series to elements 172 and 174, respectively) to accommodate the additional write port in FIG. 3. Furthermore, with every additional write port that is desired in the latch device, additional top and bottom transistor legs may be added in series to the system isolation device 160. Elements 162–168 correspond to elements 62–68 of FIG. 2. The sources of PFETs 172 and 174 are tied to Vdd. The gates of PFETs 172 and 174 receive write signals WWT1 and WB01, respectively. The drains of PFETs 172 and 174 are coupled to the sources of PFETs 162 and 164, respectively. The sources of NFETs 176 and 178 are tied to ground. The gates of NFETs 176 and 178 receives write signals WWC1 and WB11, respectively. The drains of NFETs 176 and 178 are coupled to the sources of NFETs 166 and 168, respectively.

In test mode, the operation of latch device 110 is similar to the operation of latch device 10 (refer to FIG. 2). In system mode, system data enters the latch device 110 through write port 0 or write port 1, and leaves the latch device 110 through read port 0 and read port 1. During system mode operation only one write port is allowed to be used at any one time. When write port 0 is active (WWT0=1, WWC0=0, WB00=WB10=system data), PFET 162 and NFET 166 are turned off. Depending on the value of the system data, either PFET 194 or NFET 196 will be off, turning off selective feedback inverter 30, which will break the system feedback path of latch device 110, allowing the complement of the system data to be written into node C. When the system clocks turn off (WWT0=0, WWC0=1, WB00=0, WB10=1), the selective feedback inverter 30 is allowed to be turned on through the system isolation device 160, and will hold the value written into the latch device 110. The second write port operates in a similar manner.

Although only a two port latch (FIG. 2), and a four port latch (FIG. 3) is specifically shown for the present invention, any combination of ports may be used with corresponding transistor legs added to system isolation device 60 and is within the scope of the present invention.

Thus, this invention provides a latch device that disconnects the system path and scan path in two different areas (at the scan isolation device 40 and at the selective feedback inverter 30), keeping the number of series NFETs and PFETs to a minimum, and thus, reducing the soft error rate in the system. Also, the scan-in port and read port(s) may be added as transmission gates and do not need a power supply connection, which allows for a very dense physical layout and very fast performance. Furthermore, the data value in latch device 10 may be latched before the system clocks turn off, thus allowing the latch device 10 to latch valid data during an active clock signal.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A latch device comprising:
   a feedback path;
   a retaining device operationally connected to said feedback path, said retaining device for retaining within said feedback path a logical value to be written out, said logical value being latched during an active clock signal; and
   a system isolation device for disconnecting said retaining device from said feedback path during a write operation, and for reconnecting said retaining device in response to the logical value being written out.

2. The latch device of claim 1, further comprising:
   a selective feedback inverter, coupled to said feedback path and said system isolation device,
   wherein said retaining device is disconnected from said feedback path when said system isolation device turns off said selective feedback inverter.

3. The latch device of claim 1, wherein said system isolation device receives write signals.

4. The latch device of claim 2, further comprising:
   a write port, coupled to said selective feedback inverter and said retaining device;
   an inverter, coupled to said write port; and
   a read port, coupled to said inverter.

5. The latch device of claim 1, further comprising:
   a scan-in port, for scanning in a test value; and
   a scan isolation device for disconnecting said retaining device during a test, and for reconnecting said retaining device in response to a test value being written out.

6. The latch device of claim 4, wherein said selective feedback inverter further comprises:
   a p-type transistor; and
   an n-type transistor, coupled in series with said p-type transistor,
   wherein the gates and drains of said p-type transistor and n-type transistor are coupled to said feedback path.

7. A latch device comprising:
   a feedback path;
   a retaining device operationally connected to said feedback path, said retaining device for retaining within said feedback path a logical value to be written out, said logical value being latched during an active clock signal;
   a system isolation device for disconnecting said retaining device from said feedback path during a write operation, and for reconnecting said retaining device in response to the logical value being written out;
   a selective feedback inverter, coupled to said feedback path and said system isolation device, said selective feedback inverter further comprising:
      a p-type transistor;
      an n-type transistor, coupled in series with said p-type transistor, wherein the gates and drains of said p-type transistor and n-type transistor are coupled to said feedback path, and wherein said system isolation device further comprises:
         at least one pair of p-type transistors coupled in parallel between a first voltage level and said p-type transistor of said selective feedback inverter; and at least one pair of n-type transistors coupled in parallel between a second voltage level and said n-type transistor of said selective feedback inverter, wherein said retaining device is disconnected from said feedback path when said system isolation device turns off said selective feedback inverter;
   a write port, coupled to said selective feedback inverter and said retaining device;
   an inverter, coupled to said write port; and
   a read port, coupled to said inverter.

8. The latch device of claim 7, wherein the number of pairs of said at least one pair of p-type transistors and n-type transistors correspond to a number of ports of said write port.

9. The latch device of claim 5, wherein said scan isolation device further comprises:
   a p-type transistor, the gate of said p-type transistor receiving a scan clock; and
   an n-type transistor, coupled in series with said p-type transistor, the gate of said n-type transistor receiving a complement of said scan clock.

10. The latch device of claim 9, wherein said retaining device further comprises:
    a p-type transistor, coupled in series between said p-type transistor of said scan isolation device and with a first voltage level; and
    an n-type transistor, coupled in series between said n-type transistor of said scan isolation device and with a second voltage level,
    wherein the gates of said p-type transistor and said n-type transistor of said retaining device are coupled to said selective feedback inverter.

11. A method for writing and reading a first and second logical value with a latch device having a feedback path comprising the steps of:
    a) retaining within said feedback path said first logical value to be written out;
    b) disconnecting said feedback path during a write operation;
    c) reconnecting said feedback path in response to the first logical value being written out;
    d) writing a second logical value into said feedback path of said latch device; and
    e) latching said second logical value into said feedback path during an active clock signal.

12. The method of claim 11, wherein step b) further comprises the steps of:
    b1) providing a system isolation device;
    b2) providing a selective feedback inverter, coupled to said system isolation device; and
    b3) disconnecting said feedback path with said selective feedback inverter in response to said system isolation device receiving write signals.

13. The method of claim 12, wherein step b1) further comprising the steps of:
    coupling at least one pair of p-type transistors in parallel between a first voltage level and said selective feedback inverter; and
    coupling at least one pair of n-type transistors in parallel between a second voltage level and said selective feedback inverter.

14. The method of claim 13, wherein the number of pairs of said at least one pair of p-type transistors and n-type transistors correspond to a number of ports of said write port.

15. An integrated circuit system having a scanable CMOS memory cell, said CMOS memory cell comprising:
- at least one write port receiving a logical value;
- a feedback path;
- a retaining device, coupled to said write port, for retaining within said feedback path said logical value, said retaining device latching said logical value during an active clock signal; and
- a system isolation device for disconnecting said retaining device from said feedback path during a write operation, and for reconnecting said retaining device in response to the logical value being written out.

16. The system of claim 15, further comprising:
- a selective feedback inverter, coupled to said feedback path and said system isolation device,
- wherein said retaining device is disconnected from said feedback path when said system isolation device turns off said selective feedback inverter.

17. The system of claim 15, further comprising:
- a scan-in port, for scanning in a test value; and
- a scan isolation device for disconnecting said retaining device during a test, and for reconnecting said retaining device in response to a test value being written out.

18. An integrated circuit system having a scanable CMOS memory cell, said CMOS memory cell comprising:
- at least one write port receiving a logical value;
- a feedback path;
- a retaining device, coupled to said write port, for retaining within said feedback path said logical value, said retaining device latching said logical value during an active clock signal;
- a system isolation device for disconnecting said retaining device from said feedback path during a write operation, and for reconnecting said retaining device in response to the logical value being written out;
- wherein said system isolation device further comprises:
  - at least one pair of p-type transistors coupled in parallel between a first voltage level and said selective feedback inverter; and
  - at least one pair of n-type transistors coupled in parallel between a second voltage level and said selective feedback inverter;
- a selective feedback inverter, coupled to said feedback path and said system isolation device, wherein said retaining device is disconnected from said feedback path when said system isolation device turns off said selective feedback inverter;
- a scan-in port, for scanning in a test value; and
- a scan isolation device for disconnecting said retaining device during a test, and for reconnecting said retaining device in response to a test value being written out.

19. The system of claim 18, wherein the number of pairs of said at least one pair of p-type transistors and n-type transistors correspond to a number of ports of said write port.

20. The system of claim 17, wherein said retaining device further comprises:
- a p-type transistor, coupled in series between said scan isolation device and with a first voltage level; and
- an n-type transistor, coupled in series between said scan isolation device and with a second voltage level,
- wherein the gates of said p-type transistor and said n-type transistor of said retaining device are coupled to said selective feedback inverter.

* * * * *